United States Patent
Wang et al.

(10) Patent No.: US 11,526,041 B2
(45) Date of Patent: Dec. 13, 2022

(54) ARRAY SUBSTRATE, DISPLAY PANEL AND DISPLAY DEVICE

(71) Applicants: Hefei BOE Optoelectronics Technology Co., Ltd., Anhui (CN); BOE Technology Group Co., Ltd., Beijing (CN)

(72) Inventors: Chun Wang, Beijing (CN); Yuansheng Zang, Beijing (CN); Huizi Li, Beijing (CN); Haixia Xiang, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/227,544

(22) Filed: Apr. 12, 2021

(65) Prior Publication Data
US 2022/0100023 A1    Mar. 31, 2022

(30) Foreign Application Priority Data
Sep. 25, 2020   (CN) .......................... 202022160339.1

(51) Int. Cl.
*G02F 1/1333*   (2006.01)
*H05K 1/02*   (2006.01)
*H01L 51/00*   (2006.01)
*G02F 1/1335*   (2006.01)

(52) U.S. Cl.
CPC .. *G02F 1/133305* (2013.01); *G02F 1/133514* (2013.01); *H01L 51/0097* (2013.01); *H05K 1/028* (2013.01)

(58) Field of Classification Search
CPC ................ H05K 1/028; H01L 51/0097; G02F 1/133305
See application file for complete search history.

(56) References Cited

U.S. PATENT DOCUMENTS

| | | | |
|---|---|---|---|
| 2004/0179165 A1* | 9/2004 | Kinoshita ........... | H01L 51/5281 349/158 |
| 2015/0179728 A1* | 6/2015 | Kwon ................ | H01L 27/3258 438/23 |
| 2017/0170206 A1* | 6/2017 | Lee ........................ | H01L 27/124 |
| 2017/0288005 A1* | 10/2017 | Kawata ............... | H01L 27/3276 |
| 2017/0344165 A1* | 11/2017 | Heo ...................... | H01L 27/323 |
| 2018/0097199 A1* | 4/2018 | Jo ........................ | H01L 51/5253 |
| 2018/0138431 A1* | 5/2018 | Nishimura .......... | H01L 27/3276 |
| 2018/0180924 A1* | 6/2018 | Chou ................ | G02F 1/133514 |

(Continued)

*Primary Examiner* — Michael H Caley
*Assistant Examiner* — Jonathan Y Jung
(74) *Attorney, Agent, or Firm* — ArentFox Schiff LLP; Michael Fainberg

(57) ABSTRACT

The present application provides an array substrate, a display panel and a display device. The array substrate includes a display area and an edge bending area located on one side of the display area, and further includes: a flexible base substrate, located in the display area and in the edge bending area; a first inorganic insulating layer, disposed on the flexible base substrate, where the first inorganic insulating layer has no pattern at least in the edge bending area; and a plurality of traces disposed on one side, facing away from the flexible base substrate, of the first inorganic insulating layer, where the plurality of traces extend from the display area to the edge bending area.

19 Claims, 3 Drawing Sheets

(56) References Cited

U.S. PATENT DOCUMENTS

| | | | |
|---|---|---|---|
| 2018/0197935 A1* | 7/2018 | Yuan | H01L 27/3276 |
| 2019/0148474 A1* | 5/2019 | Bu | H01L 27/1259 257/40 |
| 2019/0165076 A1* | 5/2019 | Lee | H01L 51/5253 |
| 2019/0355761 A1* | 11/2019 | Chang | H01L 51/0097 |
| 2020/0013970 A1* | 1/2020 | Wang | H01L 27/3276 |
| 2020/0150481 A1* | 5/2020 | You | G02F 1/133305 |
| 2020/0243781 A1* | 7/2020 | Kim | H01L 51/5253 |
| 2022/0100023 A1* | 3/2022 | Wang | G02F 1/133305 |

* cited by examiner

--Related Art--

ARRAY SUBSTRATE, DISPLAY PANEL AND DISPLAY DEVICE

CROSS REFERENCE TO RELATED APPLICATIONS

The present application is based on and claims priority under 35 U.S.C. 119 to Chinese Patent Application No. 202022160339.1, filed on Sep. 25, 2020, in the China National Intellectual Property Administration, the entire contents of which are incorporated herein by reference.

FIELD

The present application relates to the field of display, in particular to an array substrate, a display panel and a display device.

BACKGROUND

A liquid crystal display (LCD) panel has the advantages of being small in size, low in power consumption, free of radiation and the like, has developed rapidly in the past ten years and has become the mainstream of displays on the market. With the continuous development of the LCD panel, the global LCD panel market has gradually become saturated. In order to enhance the market competitiveness of LCD panel products, major LCD panel manufacturers have joined the development of flexible LCD panels. Therefore, the flexible LCD panels belong to an emerging field.

SUMMARY

Embodiments of the present application provide an array substrate, a display panel and a display device. The array substrate provided by the embodiment of the present application includes a display area and an edge bending area located on one side of the display area, and further includes:

a flexible base substrate located in the display area and in the edge bending area;

a first inorganic insulating layer disposed on the flexible base substrate, where the first inorganic insulating layer has no pattern at least in the edge bending area; and a plurality of traces disposed on one side, facing away from the flexible base substrate, of the first inorganic insulating layer, where the plurality of traces extend from the display area to the edge bending area.

In one embodiment, in the above array substrate provided by the embodiment of the present application, the first inorganic insulating layer includes a barrier layer and a buffer layer disposed on one side, facing away from the flexible base substrate, of the barrier layer;

the array substrate further includes a first transition area located between the display area and the edge bending area, and a second transition area located between the first transition area and the display area; and the barrier layer further has no pattern in the first transition area, and the buffer layer further has no pattern in the first transition area and the second transition area.

In one embodiment, the above array substrate provided by the embodiment of the present application further includes a first organic insulating layer disposed between the first inorganic insulating layer and a layer where the plurality of traces are located. The first organic insulating layer has a pattern in a frame area where the edge bending area is located.

In one embodiment, in the first transition area and the second transition area, a surface of the side, facing away from the flexible base substrate, of the first organic insulating layer is an inclined plane, and a gradient angle between the inclined plane and the flexible base substrate is less than or equal to 30°.

In one embodiment, in the above array substrate provided by the embodiment of the present application, a length of the second transition area is greater than or equal to 100 µm in a direction of extension of an orthographic projection of the plurality of traces on the array substrate.

In one embodiment, in the above array substrate provided by the embodiment of the present application, each of the plurality of traces located in the edge bending area has at least one hollow structure.

In one embodiment, in the above array substrate provided by the embodiment of the present application, for multiple rows of the hollow structures arranged along an extending direction of the plurality of traces, the hollow structures in adjacent rows are staggered with each other.

In one embodiment, the above array substrate provided by the embodiment of the present application further includes a second inorganic insulating layer disposed above one side, facing away from the flexible base substrate, of the plurality of traces. The second inorganic insulating layer has no pattern at least in the edge bending area.

In one embodiment, in the above array substrate provided by the embodiment of the present application, the second inorganic insulating layer further has no pattern in an area between the display area and the edge bending area.

In one embodiment, the above array substrate provided by the embodiment of the present application further includes a second organic insulating layer disposed on the side, facing away from the flexible base substrate, of the plurality of traces. An orthographic projection of the second organic insulating layer on the flexible base substrate completely covers an area where no pattern of the second inorganic insulating layer is formed.

In one embodiment, in the above array substrate provided by the embodiment of the present application, a layer where the plurality of traces are located is a source and drain metal layer.

Based on the same inventive concept, the embodiment of the present application also provides a display panel, including an array substrate and a color film substrate disposed opposing each other, and a liquid crystal layer disposed between the array substrate and the color film substrate. The array substrate is the above array substrate.

Based on the same inventive concept, the embodiment of the present application also provides a display device, including a backlight device and the above display panel located on a light emitting side of the backlight device.

DETAILED DESCRIPTION OF THE EMBODIMENTS

Figure 1:
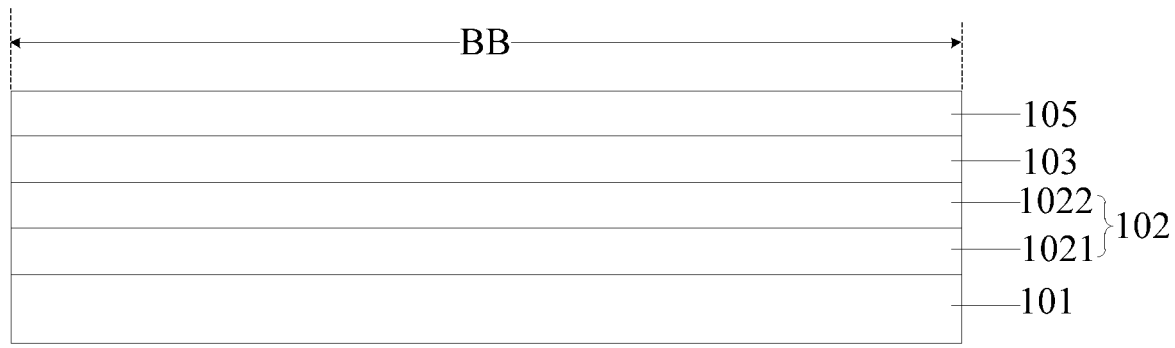
FIG. 1 is a schematic structural diagram of a lower frame area of an array substrate in the related art.

In order to make the objectives, technical solutions and advantages of the embodiments of the present application clearer, the technical solutions of the embodiments of the present application will be described clearly and completely as follows in conjunction with the accompanying drawings of the embodiments of the present application. It should be noted that the size and shape of each figure in the drawings do not reflect the true proportions, and are only intended to illustrate the content of the present application. In addition, the same or similar reference numerals indicate the same or similar elements or elements with the same or similar functions. Apparently, the described embodiments are part of the embodiments of the present application, rather than all of the embodiments. Based on the described embodiments of the present application, all other embodiments obtained by those of ordinary skill in the art without creative labor are within the protection scope of the present application.

Unless otherwise defined, the technical terms or scientific terms used herein shall be the ordinary meanings understood by those with ordinary skills in the art to which the present application belongs. "First", "second" and similar words used in the description and claims of the present application do not indicate any order, quantity or importance, but are only used to distinguish different components. "Include" or "comprise" and other similar words mean that an element or item appearing before the words covers elements or items listed after the words and their equivalents, but does not exclude other elements or items. "Inner", "outer", "upper", "lower" and the like are only used to indicate the relative positional relationship, and when the absolute position of the described object changes, the relative positional relationship may also change accordingly.

FIG. 1 is a schematic structural diagram of an array substrate included in a flexible liquid crystal display panel in a frame area BB in the related art. A first barrier layer 1021 and a first buffer layer 1022 on a flexible base substrate 101 constitute a first inorganic insulating layer 102, and the first barrier layer 1021 and the first buffer layer 1022 may be film layers arranged in an entire surface mode. The first buffer layer 1022 is also provided with a transistor, a pixel electrode and a common electrode located in a display area AA, and traces 103 arranged in the same layer as a source and drain electrode of the transistor extends from the display area AA to the frame area BB. The array substrate included in the flexible liquid crystal display panel in the frame area BB further includes a second inorganic insulating layer 105 located on one side, facing away from the flexible base substrate 101, of the traces 103.

Due to the fact that bending resistance of the first inorganic insulating layer 102 itself is poor, and mechanical properties of the flexible base substrate 101 are greatly reduced when the first inorganic insulating layer 102 is laminated on the flexible base substrate 101, cracks occur during bending the edge of the LCD panel towards the back (Pad Bending) for circuit bonding, and will affect the traces 103, resulting in poor display.

Figure 2:
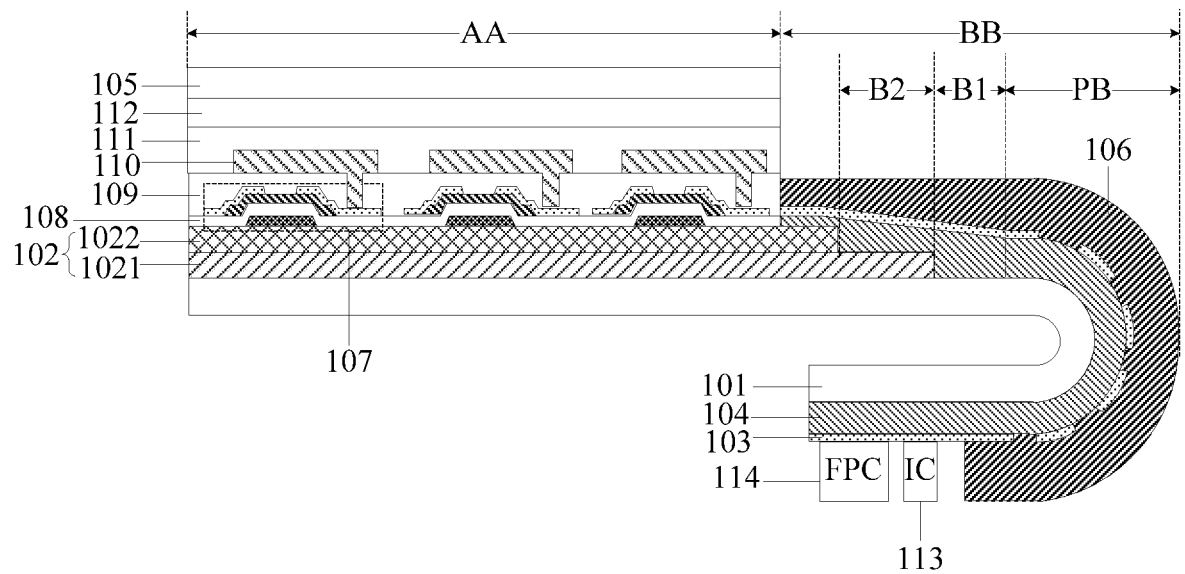
FIG. 2 is a schematic structural diagram of an array substrate provided by an embodiment of the present application.
Figure 3:
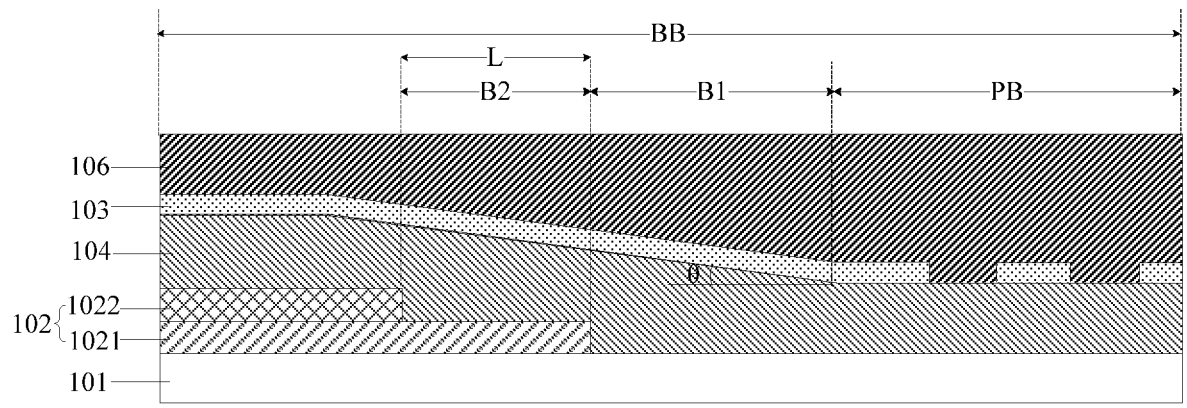
FIG. 3 is a schematic structural diagram of a lower frame area of an array substrate provided by an embodiment of the present application.

In view of the above problems in the related art, an embodiment of the present application provides an array substrate, including a display area AA and an edge bending area PB located on one side of the display area AA, as shown in FIG. 2 and FIG. 3, and may also include:

a first flexible base substrate 101 located in the display area AA and in the edge bending area PB;

a first inorganic insulating layer 102 disposed on the flexible base substrate 101, where the first inorganic insulating layer 102 has no pattern at least in the edge bending area PB; and a plurality of traces 103 disposed on one side, facing away from the flexible base substrate 101, of the first inorganic insulating layer 102, where the plurality of traces 103 extend from the display area AA to the edge bending area PB.

In the above array substrate provided by the embodiment of the present application, due to the fact that bending resistance of the first flexible base substrate 101 is good, and the first inorganic insulating layer 102 is not patterned at least in the edge bending area PB of the first flexible base substrate 101, when Pad Bending is implemented, cracks are not liable to occur, and will not extend to the traces 103, thereby effectively preventing display failure.

In some embodiments, in the above array substrate provided according to the embodiments of the present application, as shown in FIG. 2 and FIG. 3, the first inorganic insulating layer 102 may include a first barrier layer 1021 and a first buffer layer 1022 located on one side, facing away from the first flexible base substrate 101, of the first barrier layer 1021.

The above array substrate provided according to the embodiments of the present application, as shown in FIG. 2 and FIG. 3, may further include a first transition area B1 located between the display area AA and the edge bending area PB, and a second transition area B2 located between the first transition area B1 and the display area AA.

The first barrier layer 1021 also has no pattern in the first transition area B1, that is, the first barrier layer 1021 exists in the display area AA and an area between the display area AA and the first transition area B1. The first buffer layer 1022 also has no pattern in the first transition area B1 and the second transition area B2, that is, the first buffer layer 1022 exists in the display area AA and an area between the display area AA and the second transition area B2.

By arranging the first barrier layer 1021 and the first buffer layer 1022 into a stepped structure on the first flexible base substrate 101 in a frame area BB, it is advantageous for the traces 103 to perform climbing routing on the stepped structure, and breakage of the traces 103 caused by excessive breakage difference is avoided. In addition, the first barrier layer 1021 and the first buffer layer 1022 may be made of silicon oxide, silicon nitride and the like into a single-layer or stacked-layer structure to prevent water and oxygen from entering, so that influences of the water and oxygen on performance of a transistor are avoided, and overall reliability of a product is guaranteed.

In some embodiments, the above array substrate provided according to the embodiments of the present application, as shown in FIG. 2 and FIG. 3, may further include a first organic insulating layer 104 disposed between the first inorganic insulating layer 102 and a layer where the plurality of traces 103 are located. The first organic insulating layer 104 only has a pattern in the frame area BB (generally a lower frame) where the edge bending area PB is located.

The first organic insulating layer 104, arranged between the first inorganic insulating layer 102 in the frame area BB where the edge bending area PB is located and the layer where the plurality of traces 103 are located, effectively fills grooved areas of the first inorganic insulating layer 102 in the edge bending area PB, the first transition area B1 and the second transition area B2, ensures climbing needs of the plurality of traces 103 and greatly reduces a risk of breaking of the traces 103. In some embodiments, a material of the first organic insulating layer 104 may be polyvinyl ether phthalate, polyethylene naphthalate, polycarbonate, polyarylate, polyetherimide, polyether sulfone, polyimide and the like, which is not limited here.

In some embodiments, in the above array substrate provided according to the embodiments of the present application, as shown in FIG. 3, in the first transition area B1 and the second transition area B2, a surface of one side, facing away from the first flexible base substrate 101, of the first organic insulating layer 104 is an inclined plane, and a gradient angle θ between the inclined plane and the first flexible base substrate 101 may be less than or equal to 30°, such as 5°, 10°, 15°, 20°, 25°, 30°, etc. A small gradient angle θ facilitates climbing of the traces 103 and avoids a problem of breakage caused by an excessively large gradient angle θ.

In some embodiments, in the above array substrate provided according to the embodiments of the present application, as shown in FIG. 3, a length L of the second transition area B2 in a direction of extension of an orthographic projection of the traces 103 on the array substrate may be greater than or equal to 100 μm to make the gradient angle θ small. In addition, it is worth noting that the greater the length L of the second transition area B2 is, the smaller the gradient angle θ will be. Therefore, if a space of the frame area BB allows, a value of the length L of the second transition area B2 may be increased as much as possible.

Figure 4:
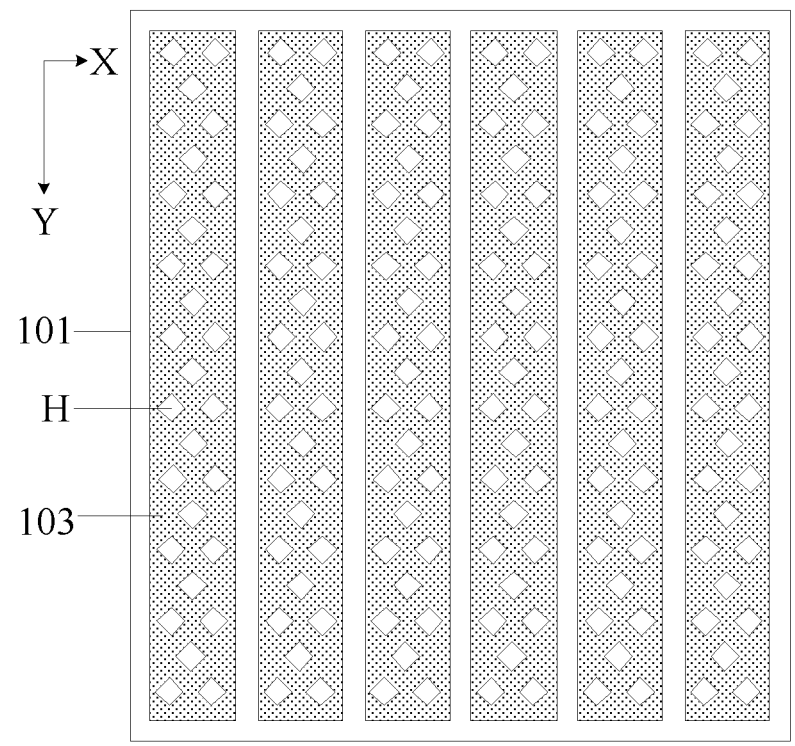
FIG. 4 is a schematic structural diagram of traces in an edge bending area provided by an embodiment of the present application.

In some embodiments, in the above array substrate provided according to the embodiments of the present application, in order to enhance bending resistance of the traces 103, as shown in FIG. 4, each of the traces 103 located in the edge bending area PB has at least one hollow structure H. The hollow structures H may have a variety of shapes, such as any regular or irregular figures like nets, strips, circles, triangles, squares, rhombuses, trapezoids, pentagrams and regular polygons, which are not limited here. In addition, a diameter of a circumscribed circle of each of the hollow structures H may be greater than or equal to 3 μm and less than or equal to 8 μm, such as 3 μm, 4 μm, 5 μm, 6 μm, 7 μm, 8 μm, etc.

In some embodiments, in the above array substrate provided according to the embodiments of the present application, in a perpendicular direction X of the extending direction Y of the traces 103, the hollow structures H of adjacent rows are staggered with each other. That is, for multiple rows of the hollow structures arranged along the extending direction Y of the traces 103, the hollow structures in adjacent rows are staggered with each other, to block crack extension through the staggered hollow structures H, and possible local cracks extending to the entire traces 103 are effectively avoided. The hollow structures H on each of the traces 103 may be symmetrical about a central axis in the extending direction Y of the traces 103, or may be arranged asymmetrically, which is not limited here.

In some embodiments, the above array substrate provided according to the embodiments of the present application, as shown in FIG. 2 and FIG. 3, may further include a second inorganic insulating layer 105 disposed on one side, facing away from the first flexible base substrate 101, of the plurality of traces 103. The second inorganic insulating layer 105 has no pattern at least in the edge bending area PB to prevent cracks generated in the second inorganic insulating layer 105 from extending to the traces 103 during Pad Bending to cause poor display.

In some embodiments, as shown in FIG. 2 and FIG. 3, the second inorganic insulating layer 105 also has no pattern in an area between the display area AA and the edge bending area PB, that is, the second inorganic insulating layer 105 only exists in the AA area and does not exist in the frame area BB. In some embodiments, a material of the second inorganic insulating layer 105 may be silicon oxide, silicon nitride and the like.

In some embodiments, the above array substrate provided according to the embodiments of the present application, as shown in FIG. 2 and FIG. 3, may further include a second organic insulating layer 106 disposed on one side, facing away from the first flexible base substrate 101, of the traces 103. An orthographic projection of the second organic insulating layer 106 on the first flexible base substrate 101 completely covers an area where no pattern of the second inorganic insulating layer 105 is formed.

Due to the fact that the second inorganic insulating layer 105 is used to protect the traces 103 in the related art (as shown in FIG. 1), the traces 103 will be exposed in an area where the second inorganic insulating layer 105 is removed in the present application. Therefore, the traces 103 may be protected by means of the second organic insulating layer 106. In some embodiments, a material of the second organic insulating layer 106 may be polyvinyl ether phthalate, polyethylene naphthalate, polycarbonate, polyarylate, polyetherimide, polyether sulfone, polyimide and the like, which is not limited here.

In some embodiments, the above array substrate provided according to the embodiments of the present application, as shown in FIG. 2, may further include a plurality of transistors 107, a gate insulating layer 108 disposed between gate electrodes and source electrodes of the transistors 107, a first passivation layer 109 disposed on active layers of the transistors 107, a plurality of pixel electrodes 110 disposed on the passivation layer 109, a second passivation layer 111 disposed on the plurality of pixel electrodes 110, and a common electrode 112 disposed between the second passivation layer 111 and the second inorganic insulating layer 105. Each pixel electrode 110 is electrically connected with a drain electrode of one transistor 107 through a via hole penetrating through the first passivation layer 109. In some embodiments, in the above array substrate provided according to the embodiments of the present application, the layer where the races 103 are located is a source and drain metal layer where the source electrodes and drain electrodes of the transistors 107 are located. In addition, the array substrate is further bound with an integrated circuit (IC) 113 and a flexible printed circuit (FPC) 114 in a bonding mode.

Figure 5:
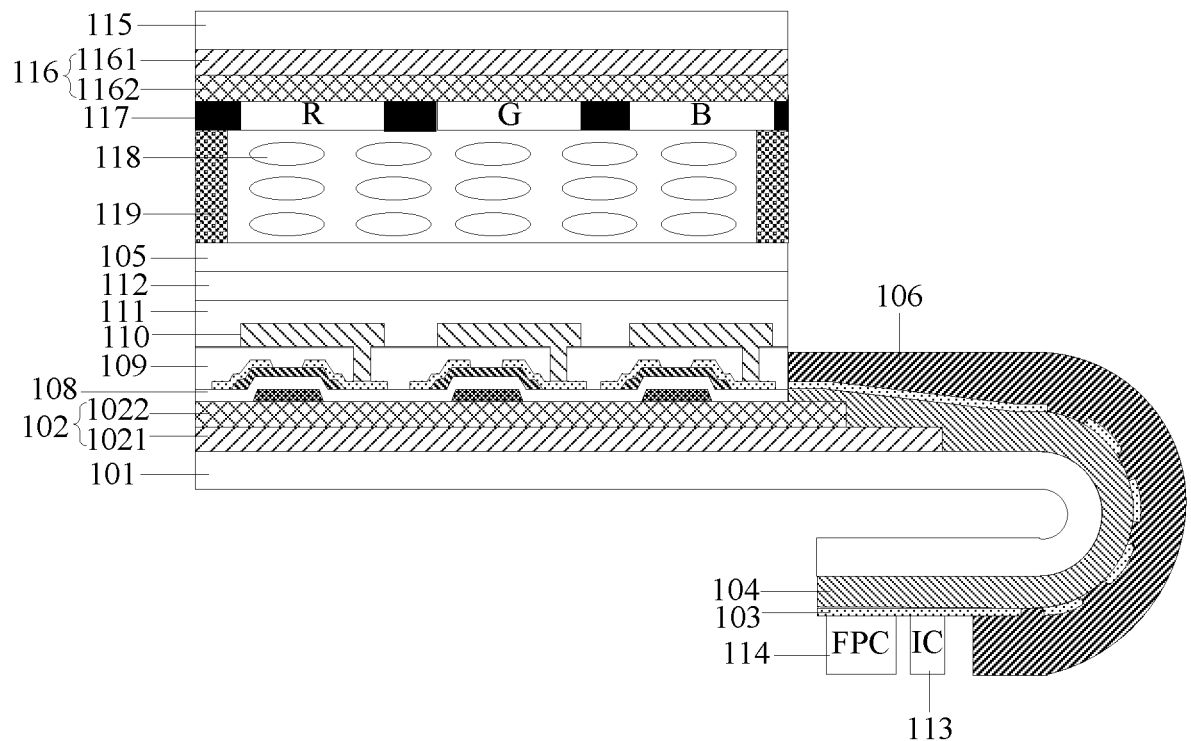
FIG. 5 is a schematic structural diagram of a display panel provided by an embodiment of the present application.

Based on the same inventive concept, the embodiment of the present application provides a display panel, as shown in FIG. 5, including an array substrate and a color film substrate which are oppositely arranged. The array substrate is the above array substrate provided by the embodiment of the present application. The color film substrate may include a second flexible base substrate 115, a third inorganic insulating layer 116 (specifically composed of a second barrier layer 1161 and a second buffer layer 1162) disposed on the second flexible base substrate 115, black matrices 117 disposed on the third inorganic insulating layer 116, and red light color resistance R, green light color resistance G and blue light color resistance B located in an opening area of each of the black matrices 117. In addition, the above display panel provided by the embodiment of the present application further includes a liquid crystal layer 118 and a frame sealant 119 disposed between the color film substrate and the array substrate. The color film substrate, the array substrate, the liquid crystal layer 118 and the frame sealant 119 jointly form a liquid crystal cell. Due to the fact that a principle that the display panel solves problems is similar to a principle that the above array substrate solves problems, implementation of the display panel provided by the embodiment of the present application may refer to implementation of the above array substrate provided by the embodiment of the present application, and unnecessary details will not be given to repetitions.

In addition, the above display panel provided by the embodiment of the present application is described by taking an Advanced Dimension Switch (ADS) type liquid crystal display as an example. In some embodiments, the above display panel provided by the embodiment of the present application may also be a Twisted Nematic (TN) type liquid crystal display, a High Aperture Ratio-High-Advanced Dimension Switch (HADS) type liquid crystal display, an In-Plane Switch (IPS) type liquid crystal display and the like, which is not limited here.

Figure 6:
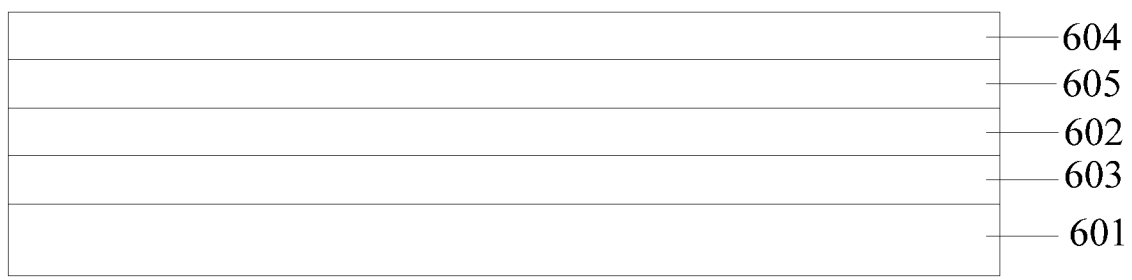
FIG. 6 is a schematic structural diagram of a display device provided by an embodiment of the present application.

Based on the same inventive concept, the embodiment of the present application also provides a display device, as shown in FIG. 6, including a backlight device 601 and a display panel 602 located on a light emitting side of the backlight device 601. The display panel 602 is the above display panel provided by the embodiment of the present application. In some embodiments, the backlight device 601 and the display panel 602 may be fixed through a first optical adhesive 603. In addition, the display device may further include a protective cover plate 604, and the protective cover plate 604 and the display panel 602 may be fixed through a second optical adhesive 605.

In some embodiments, the above display device provided according to the embodiments of the present application may be any product or component with a display function such as a mobile phone, a tablet computer, a television, a display, a notebook computer, a digital photo frame, a navigator, a smart watch, a fitness wristband and a personal digital assistant. Other indispensable components of the display device are understood by those of ordinary skill in the art, and will not be repeated here, nor should they be used as a limitation to the present application. In addition, due to the fact that a principle that the display device solves problems is similar to the principle that the above display panel solves problems, implementation of the display device may refer to the implementation of the above display panel, and unnecessary details will not be given to repetitions.

Correspondingly, a specific manufacturing process of the above display device provided by the embodiment of the present application is as follows.

Step one, a first flexible base substrate 101 is prepared on a first mother board made of glass, and the preparation may include working procedures such as coating, heat vacuum drying (HVCD), Pre Bake and Post Bake.

Step two, a first barrier layer 1021 and a first buffer layer 1022 are sequentially prepared through a chemical vapor deposition (CVD) process. A material of the first barrier layer 1021 is silicon oxide (SiOx), a thickness is between 500 Å and 5000 Å, and there is no pattern in an edge bending area PB and a first transition area B1. A material of the first buffer layer 1022 is silicon nitride (SiNx), a thickness is between 50 Å and 500 Å, and there is no pattern in the edge bending area PB, the first transition area B1 and a second transition area B2. Then a first organic insulating layer 104 is formed on the first buffer layer 1022. In some embodiments, the first organic insulating layer 104 is located in a frame area BB (generally a lower frame) where the edge bending area PB is located.

Step three, gate electrodes of transistors 107, a gate insulating layer 108, active layers of the transistors 107, source electrodes and drain electrodes of the transistors 107 and traces 103 which are arranged in the same layer are sequentially manufactured on the first buffer layer 1022. A part of the traces 103 in the edge bending area PB has hollow structures H. Each of the gate electrodes includes a molybdenum metal layer with a thickness of 150 Å, an aluminum metal layer with a thickness of 3000 Å and a molybdenum metal layer with a thickness of 800 Å which are arranged in a stacked mode. A source and drain metal layer where the source electrodes, the drain electrodes and the traces 103 are located includes a titanium metal layer, an aluminum metal layer and a titanium metal layer which are arranged in a stacked mode.

Step four, a first passivation layer 109 with a plurality of via holes, a plurality of pixel electrodes 110, a second passivation layer 111, a common electrode 112, a second inorganic insulating layer 105 and a second organic insulating layer 106 are sequentially formed on the source and drain metal layer where the source electrodes, the drain electrodes and the traces 103 are located. The pixel electrodes 110 are electrically connected with the drain electrodes of the transistors 107 through the via holes penetrating through the first passivation layer 109. The second inorganic insulating layer 105 has no pattern in the frame area BB (generally the lower frame) where the edge bending area PB is located. The second organic insulating layer 106 only has a pattern in the frame area BB (generally the lower frame) where the edge bending area PB is located.

Step five, a second flexible base substrate 115 is formed on a second mother board made of glass, and a second barrier layer 1161 with a thickness between 500 Å and 5000 Å and a second buffer layer 1162 with a thickness between 50 Å and 500 Å are sequentially formed on the second flexible base substrate 115 through the CVD process. Then black matrices 117, red light color resistance R, green light color resistance G, blue light color resistance B, an overcoat (OC) and a photo spacer (PS) are prepared on the second buffer layer 1162 through processes such as exposure and development.

Step six, the first mother board and the second mother board are subjected to a one drop filling (ODF) alignment process, and laser cutting is adopted to form a single cell.

Step seven, after the integrated circuit (IC) 113 and the flexible printed circuit (FPC) 114 are bonded in a module (MDL) factory, a laser lift-off (LLO) technology is adopted to remove the mother boards made of glass on both sides, and polarizer (POL) attachment, pad bending and assembly of a backlight module 601 and a protective cover plate 604 are carried out.

So far, assembly of the flexible liquid crystal display device provided according to the embodiments of the present application is completed.

According to the above array substrate, the display panel and the display device provided according to the present application, the array substrate includes a flexible base substrate, where the flexible base substrate is located in the display area of the array substrate, and in the edge bending area located on one side of the display area; a first inorganic insulating layer disposed on the flexible base substrate, where the first inorganic insulating layer has no pattern at least in the edge bending area; and a plurality of traces disposed on one side, facing away from the flexible base substrate, of the first inorganic insulating layer, where the plurality of traces extend from the display area to the edge bending area. Due to the fact that mechanical properties against bending of the flexible base substrate is good, and the first inorganic insulating layer has no pattern at least in the edge bending area of the flexible base substrate, when Pad Bending is implemented, cracks are not liable to occur, and will not extend to the traces, thereby effectively preventing display failure.

Apparently, those skilled in the art may make various modifications and variations to the present application without departing from the spirit and scope of the present application. In this way, if these modifications and variations of the present application fall within the scope of the claims of the present application and their equivalent technologies, the present application is also intended to include these modifications and variations.

What is claimed is:

1. An array substrate, comprising a display area and an edge bending area located on one side of the display area, and further comprising:
   a flexible base substrate located in the display area and in the edge bending area;
   a first inorganic insulating layer disposed on the flexible base substrate, wherein the first inorganic insulating layer has no pattern at least in the edge bending area;
   a plurality of traces disposed on one side, facing away from the flexible base substrate, of the first inorganic insulating layer, wherein the plurality of traces extend from the display area to the edge bending area; and
   a first organic insulating layer disposed between the first inorganic insulating layer and a layer where the plurality of traces are located, wherein the first organic insulating layer only has a pattern in a frame area where the edge bending area is located.

2. The array substrate of claim 1, wherein the first inorganic insulating layer comprises a barrier layer and a buffer layer disposed on one side, facing away from the flexible base substrate, of the barrier layer;
   the array substrate further comprises a first transition area located between the display area and the edge bending area, and a second transition area located between the first transition area and the display area; and
   the barrier layer further has no pattern in the first transition area, and the buffer layer further has no pattern in the first transition area and the second transition area.

3. The array substrate of claim 2, wherein in the first transition area and the second transition area, a surface of the side, facing away from the flexible base substrate, of the first organic insulating layer is an inclined plane, and a gradient angle between the inclined plane and the flexible base substrate is less than or equal to 30°.

4. The array substrate of claim 2, wherein a length of the second transition area is greater than or equal to 100 μm in a direction of extension of an orthographic projection of the plurality of traces on the array substrate.

5. The array substrate of claim 1, wherein each of the plurality of traces located in the edge bending area has at least one hollow structure.

6. The array substrate of claim 5, wherein for multiple rows of the hollow structures arranged along an extending direction of the plurality of traces, the hollow structures in adjacent rows are staggered with each other.

7. The array substrate of claim 1, further comprising a second inorganic insulating layer disposed above one side, facing away from the flexible base substrate, of the plurality of traces, wherein the second inorganic insulating layer has no pattern at least in the edge bending area.

8. The array substrate of claim 7, wherein the second inorganic insulating layer further has no pattern in an area between the display area and the edge bending area.

9. The array substrate of claim 7, further comprising a second organic insulating layer disposed on the side, facing away from the flexible base substrate, of the plurality of traces, wherein an orthographic projection of the second organic insulating layer on the flexible base substrate completely covers an area where no pattern of the second inorganic insulating layer is formed.

10. The array substrate of claim 1, wherein a layer where the plurality of traces are located is a source and drain metal layer.

11. A display panel, comprising an array substrate and a color film substrate disposed opposing each other, and a liquid crystal layer disposed between the array substrate and the color film substrate, wherein the array substrate comprises a display area and an edge bending area located on one side of the display area, and further comprises:
    a flexible base substrate located in the display area and in the edge bending area;
    a first inorganic insulating layer disposed on the flexible base substrate, wherein the first inorganic insulating layer has no pattern at least in the edge bending area;
    a plurality of traces disposed on one side, facing away from the flexible base substrate, of the first inorganic insulating layer, wherein the plurality of traces extend from the display area to the edge bending area; and
    a first organic insulating layer disposed between the first inorganic insulating layer and a layer where the plurality of traces are located, wherein the first organic insulating layer only has a pattern in a frame area where the edge bending area is located.

12. The display panel of claim 11, wherein the first inorganic insulating layer comprises a barrier layer and a buffer layer disposed on one side, facing away from the flexible base substrate, of the barrier layer;
    the array substrate further comprises a first transition area located between the display area and the edge bending area, and a second transition area located between the first transition area and the display area; and
    the barrier layer further has no pattern in the first transition area, and the buffer layer further has no pattern in the first transition area and the second transition area.

13. The display panel of claim 12, wherein
    in the first transition area and the second transition area, a surface of the side, facing away from the flexible base substrate, of the first organic insulating layer is an inclined plane, and a gradient angle between the inclined plane and the flexible base substrate is less than or equal to 30°.

14. The display panel of claim 12, wherein a length of the second transition area is greater than or equal to 100 μm in a direction of extension of an orthographic projection of the plurality of traces on the array substrate.

15. The display panel of claim 11, wherein each of the plurality of traces located in the edge bending area has at least one hollow structure; and
    for multiple rows of the hollow structures arranged along an extending direction of the plurality of traces, the hollow structures in adjacent rows are staggered with each other.

16. The display panel of claim 11, further comprising a second inorganic insulating layer disposed above one side, facing away from the flexible base substrate, of the plurality of traces, wherein the second inorganic insulating layer has no pattern at least in the edge bending area.

17. The display panel of claim 16, wherein the second inorganic insulating layer further has no pattern in an area between the display area and the edge bending area.

18. The display panel of claim 16, further comprising a second organic insulating layer disposed on the side, facing away from the flexible base substrate, of the plurality of traces, wherein an orthographic projection of the second organic insulating layer on the flexible base substrate completely covers an area where no pattern of the second inorganic insulating layer is formed.

19. A display device, comprising a backlight device and the display panel of claim 11 located on a light emitting side of the backlight device.

* * * * *